United States Patent
Chen

(10) Patent No.: US 12,096,597 B2
(45) Date of Patent: Sep. 17, 2024

(54) COOLING DEVICE AND DATA PROCESSING APPARATUS

(71) Applicant: ANTPOOL TECHNOLOGIES LIMITED, Hong Kong (CN)

(72) Inventor: Hanlin Chen, Beijing (CN)

(73) Assignee: ANTPOOL TECHNOLOGIES LIMITED, Hong Kong (CN)

( * ) Notice: Subject to any disclaimer, the term of this patent is extended or adjusted under 35 U.S.C. 154(b) by 365 days.

(21) Appl. No.: 17/612,943

(22) PCT Filed: Jun. 25, 2019

(86) PCT No.: PCT/CN2019/092837
§ 371 (c)(1),
(2) Date: Nov. 19, 2021

(87) PCT Pub. No.: WO2020/232794
PCT Pub. Date: Nov. 26, 2020

(65) Prior Publication Data
US 2022/0232736 A1 Jul. 21, 2022

(30) Foreign Application Priority Data

May 21, 2019 (WO) ................ PCT/CN2019/087718

(51) Int. Cl.
*H05K 7/20* (2006.01)
(52) U.S. Cl.
CPC ..... *H05K 7/20336* (2013.01); *H05K 7/20327* (2013.01); *H05K 7/20409* (2013.01)
(58) Field of Classification Search
CPC ............... H05K 7/203; H05K 7/20336; H05K 7/20327; H05K 7/20409; H01L 23/427;
(Continued)

(56) References Cited

U.S. PATENT DOCUMENTS

| | | | | | |
|---|---|---|---|---|---|
| 3,417,814 A | * | 12/1968 | Oktay | .................... | H05K 7/203 174/15.1 |
| 4,260,014 A | * | 4/1981 | Feehan | .................... | H01J 7/28 165/104.21 |
| 5,004,973 A | * | 4/1991 | Taraci | .................... | G05D 23/01 165/80.4 |

(Continued)

FOREIGN PATENT DOCUMENTS

| CN | 104519722 A | 4/2015 |
|---|---|---|
| CN | 206713232 U | 12/2017 |

(Continued)

OTHER PUBLICATIONS

English translation of CN 108966603A, the entire document. (Year: 2018).*

(Continued)

*Primary Examiner* — Tho V Duong
(74) *Attorney, Agent, or Firm* — ANOVA LAW GROUP, PLLC

(57) ABSTRACT

Embodiments of the present disclosure relate to a cooling device, including a housing and a heat dissipation assembly. A sealed space for accommodating cooling liquid is formed in the housing. The cooling liquid is in contact with a to-be-cooled component. The heat dissipation assembly includes a heat dissipation assembly body and a heat conducting pipe communicating with the heat dissipation assembly body. The heat dissipation assembly body is arranged in the sealed space formed by the housing. The heat dissipation assembly body is configured to, after the cooling liquid transforms into the gas by absorbing the heat of the to-be-cooled component, absorb the heat of the gas to convert the gas into the liquid. The heat conducting pipe is at least partially located outside the housing. The heat dissipation assembly body is arranged at ½ to ¾ the position along the height direction in the housing.

18 Claims, 5 Drawing Sheets

(58) Field of Classification Search
CPC ... H01L 23/44; H01L 23/473; F28D 1/05308; F28D 7/1653; F28D 7/1607; F28D 7/16; F28D 7/1684; F28D 7/1638
See application file for complete search history.

(56) References Cited

U.S. PATENT DOCUMENTS

| | | | | |
|---|---|---|---|---|
| 6,588,498 | B1 * | 7/2003 | Reyzin | F28D 15/0266 174/15.2 |
| 7,604,040 | B2 * | 10/2009 | Ghosh | H01L 23/473 165/80.4 |
| 7,957,145 | B2 * | 6/2011 | Suzuki | H05K 7/20936 165/104.34 |
| 8,619,425 | B2 * | 12/2013 | Campbell | H05K 7/203 361/689 |
| 9,620,435 | B2 * | 4/2017 | Endo | F28D 15/0266 |
| 2005/0189096 | A1 * | 9/2005 | Wilson | H01L 23/473 257/E23.098 |
| 2006/0162898 | A1 * | 7/2006 | Reyzin | H01L 23/473 257/E23.098 |
| 2018/0020570 | A1 | 1/2018 | Fujiwara et al. | |

FOREIGN PATENT DOCUMENTS

| | | |
|---|---|---|
| CN | 207560639 U | 6/2018 |
| CN | 108966603 A | 12/2018 |

OTHER PUBLICATIONS

The World Intellectual Property Organization (WIPO) International Search Report for PCT/CN2019/092837 Jan. 31, 2020 6 Pages.

* cited by examiner

COOLING DEVICE AND DATA PROCESSING APPARATUS

CROSS-REFERENCES TO RELATED APPLICATION

This application is a national phase entry under 35 U.S.C. § 371 of International Application No. PCT/CN2019/092837, filed on Jun. 25, 2019, which claims priority to International Application No. PCT/CN2019/087718, filed on May 21, 2019, the entire contents of both of which are incorporated herein by reference in their entirety.

TECHNICAL FIELD

The present disclosure generally relates to the cooling technology field, for example, to a cooling device and a data processing apparatus.

BACKGROUND

The data processing apparatus usually is equipped with a specialized processing chip to improve processing efficiency. The specialized data processing chip often are densely packed in the data processing apparatus, which causes a heat generation problem of the data processing apparatus.

In the related technology, the endothermic phase change is used to cool a single chip. To dissipate heat of a large number of densely placed chips in the data processing apparatus, there has been no good solutions applying the current endothermic phase change technology.

SUMMARY

Embodiments of the present disclosure provide a cooling device and a data processing apparatus to improve the cooling efficiency of the data processing apparatus.

In a first aspect, embodiments of the present disclosure provide a cooling device, including a housing and a heat dissipation assembly. A sealed space for accommodating cooling liquid is formed in the housing. The cooling liquid is in contact with a to-be-cooled component. The heat dissipation assembly includes a heat dissipation assembly body and a heat conducting pipe communicating with the heat dissipation assembly body. The heat dissipation assembly body is arranged in the sealed space formed by the housing. The heat dissipation assembly body is configured to, after the cooling liquid transforms into a gas by absorbing heat of the to-be-cooled component, absorb heat of the gas to convert the gas into the liquid. The heat conducting pipe is at least partially located outside of the housing. The heat dissipation assembly body is arranged at ½ to ¾ position along a height direction of the housing, and the heat dissipation assembly body divides the sealed space into a first space for accommodating the cooling liquid and the to-be-cooled component and a second space for maintaining pressure.

In a possible embodiment, the heat dissipation assembly body further includes a cooling pipe and a plurality of heat dissipation fins arranged at the cooling pipe. The heat conducting pipe communicates with the cooling pipe.

In a possible embodiment, the heat dissipation assembly body further includes a first container and a second container arranged opposite to each other. The cooling pipe includes a plurality of rows of pipes arranged in parallel. An end of the cooling pipe communicates with the first container, and another end of the cooling pipe communicates with the second container to circulate heat-exchange liquid in the first container, the cooling pipe, and the second container.

In a possible embodiment, the heat conducting pipe includes a liquid inlet pipe and a liquid outlet pipe. The first container includes a liquid inlet and a liquid outlet at top of the first container. The liquid inlet pipe is connected to the liquid inlet. The liquid outlet pipe is connected to the liquid outlet.

In a possible embodiment, the cooling pipe includes a flat pipe.

In a possible embodiment, a wave-shaped heat dissipation fin is arranged in a gap between neighboring cooling pipes.

In a possible embodiment, the cooling pipe is inserted in the heat dissipation fin through a Fin insertion process. The cooling pipe includes an inlet and an outlet. The heat conducting pipe includes a liquid inlet pipe and a liquid outlet pipe. The liquid inlet pipe is connected to the inlet of the cooling pipe. The liquid outlet pipe is connected to the outlet of the cooling pipe.

In a possible embodiment, the cooling device further includes at least one fan. The fan is arranged in the second space and configured to enhance the flow of the gas.

In a possible embodiment, the fan is arranged at the heat dissipation assembly body. An air outlet of the fan faces the heat dissipation assembly body. The fan adjusts a rotation speed according to the pressure of the sealed space.

In a possible embodiment, a wire hole is arranged at the housing and configured to arrange a power cord through. The power cord is configured to provide power to the to-be-cooled component and the fan. The wire hole is sealed through a seal material.

In a possible embodiment, the cooling device further includes a third container. The third container is arranged outside of the housing. The third container communicates with the heat conducting pipe.

In a possible embodiment, the cooling liquid is insulation liquid. A boiling point of the cooling liquid is lower than a predetermined threshold.

In a possible embodiment, the to-be-cooled component is a hashboard. A plurality of data processing chips are arranged at the hashboard.

In a second aspect, embodiments of the present disclosure provide a data processing apparatus, including a data processing apparatus and a cooling device according to any one of the first aspects.

In the cooling device and the data processing apparatus provided by embodiments of the present disclosure, the cooling liquid may be accommodated inside an outer housing of the cooling device. After the cooling liquid transforms into the gas by absorbing the heat of the to-be-cooled assembly, the gas is converted into the liquid through the heat dissipation assembly. Thus, the to-be-cooled assembly is cooled. The cooling efficiency is high. The cooling liquid is circulated and used.

BRIEF DESCRIPTION OF THE DRAWINGS

One or more embodiments are exemplarily described by the accompanying drawings. These exemplary descriptions and the accompanying drawings do not constitute a limitation on embodiments of the present disclosure. Elements with same reference numerals in the accompanying drawings are shown as similar elements. The accompanying drawings do not constitute a ratio limitation, and among them.

REFERENCE NUMERALS

Figure 1:
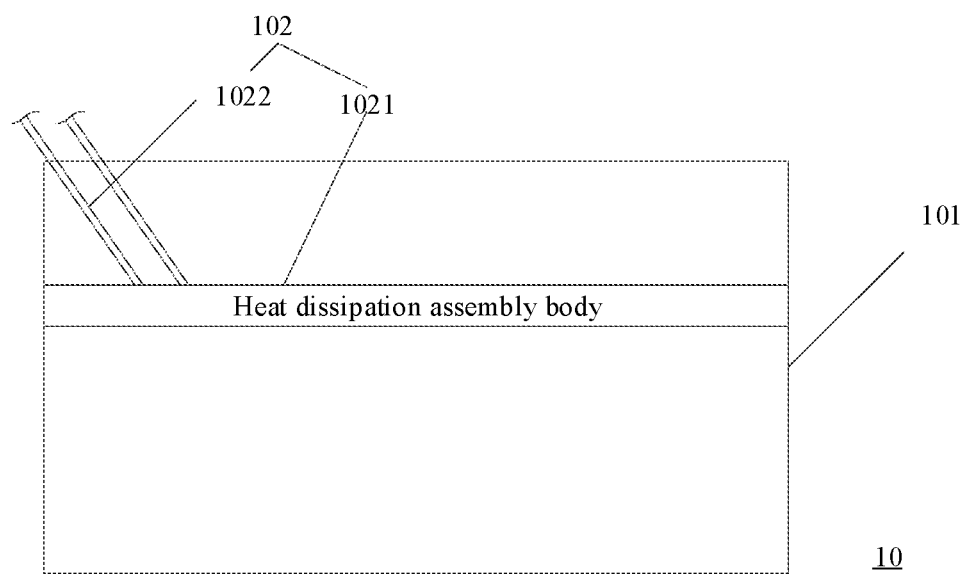
FIG. 1 is a schematic front view structural diagram of a cooling device according to an embodiment of the present disclosure.

10 Cooling device;
101 Outer housing;
102 Heat dissipation assembly;
1021 Heat dissipation assembly body;
1022 Heat conducting pipe;
1023 Cooling pipe;
1024 Heat dissipation fin;
1025 First container;
1026 Second container;
1027 Liquid inlet;
1028 Liquid outlet;
1011 Container body;
1012 Bottom plate;
1013 Side plate;
103 Third container;
104 Fan;
105 Electrical wire hole;
106 Opening hole.

DETAILED DESCRIPTION OF THE EMBODIMENTS

To understand the features and technical content of the embodiments of the present disclosure with more details, implementation of embodiments of the present disclosure is described in detail below with reference to the accompanying drawings. The accompanying drawings are for reference only and are not used to limit embodiments of the present disclosure. In the following technical description, to facilitate explanation, a number of details are used to provide a sufficient understanding of the disclosed embodiments. However, without these details, one or more embodiments can still be implemented. In other cases, to simplify the accompanying drawings, well-known structures and devices may be simplified for display.

In the description of the present disclosure, it should be understood that the orientation or positional relationship indicated by terms "up," "down," "front," "rear," "left," "right," etc. are based on the orientation or position relationship indicated by the accompanying drawings. The terms are only to facilitate to simplify the description, rather than indicating or implying that the device or element referred to must have a specific orientation, be constructed and operated in the specific orientation. Therefore, the terms cannot be understood as a limitation of the present disclosure.

In the description of the present disclosure, unless otherwise clearly defined and limited, the terms "installed," "connected," "coupled," "fixed," and other terms should be understood in a broad sense. For example, it may include a fixed connection, a detachable connection, or integrated. It may also be directly connected or indirectly connected through an intermediate medium. It may be an internal communication between two elements or an interaction relationship between two elements, unless otherwise clearly defined. For those of ordinary skill in the art, the specific meanings of the above-mentioned terms in the present disclosure may be understood according to specific situations.

In the present disclosure, unless otherwise clearly defined and limited, a first feature "on" or "under" a second feature may include that the first and the second features are in direct contact, or the first and second features may be indirect contact through an intermediate medium. Moreover, the first feature "above," "over," and "on" the second feature may mean that the first feature is directly above or obliquely above the second feature, or merely mean that the horizontal height of the first feature is higher than the second feature. The first feature "below," "under," and "beneath" the second feature may mean that the first feature is directly below or obliquely below the second feature, or merely mean that the horizontal height of the first feature is smaller than the second feature.

First, application scenarios involved in embodiments of the present disclosure are introduced below.

A cooling device provided by embodiments of the present disclosure may be applied to any scenario where a to-be-cooled component needs to be cooled, for example, for certain electronic components, such as chips. Because the chips (especially data processing chips with high hash rate) may continue to generate relatively large heat during operation, a corresponding cooling device may need to be equipped to absorb the heat generated by the chips to cool the chips.

In embodiments of the present disclosure, the cooling device may cool a hashboard, especially a plurality of data processing chips included in the hashboard.

For example, generation of a digital voucher requires a large amount of computation, which requires a processing apparatus of the digital voucher to be equipped with professional processing chips. Chip density of the processing apparatus of the digital voucher is high. The processing chips may generate relatively large heat during operation. Therefore, heat dissipation and cooling may need to be performed immediately.

When the digital voucher is related to or embodied as digital currency, the processing apparatus of the digital voucher may include a digital currency mining machine. The digital currency may include encrypted currency such as Bitcoin.

In the cooling device of embodiments of the present disclosure, the cooling liquid is contained inside the cooling device. After the cooling liquid is transformed into a gas by absorbing the heat of the to-be-cooled component, the gas may be converted into the liquid by the heat dissipation assembly to realize cooling of the to-be-cooled component. Cooling efficiency may be high. The cooling liquid may be circulated and used.

The technical solution shown in the present disclosure is described in detail through embodiments of the present disclosure below.

The following embodiments may be combined with each other, and the same or similar concepts or processes may not be repeated in some embodiments.

FIG. 1 is a schematic front view structural diagram of a cooling device according to an embodiment of the present disclosure. As shown in FIG. 1, embodiments of the present disclosure provide a cooling device 10. The cooling device 10 includes a housing 101 and a heat dissipation assembly 102. A sealed space, which can accommodate cooling liquid, is formed inside the housing 101. The cooling liquid may contact the to-be-cooled component. The heat dissipation assembly 102 includes a heat dissipation assembly body 1021 and a heat conducting pipe 1022 communicated to the heat dissipation assembly body 1021. The heat dissipation assembly 1021 is arranged in the sealed space formed by the housing 101. The heat dissipation assembly body 1021 may be configured to absorb the heat of the gas to covert the gas into the liquid after the cooling liquid transforms into the gas by absorbing the heat of the to-be-cooled component. The heat conducting pipe 1022 may be at least partially located outside the housing 101.

Figure 3:
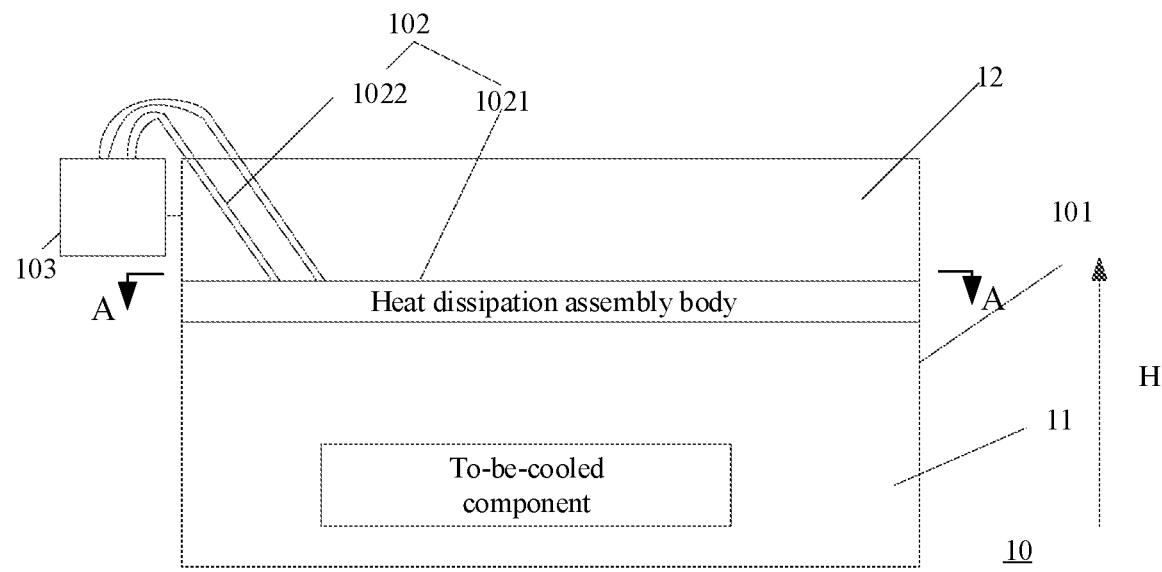
FIG. 3 is a schematic front view structural diagram of a cooling device according to another embodiment of the disclosure.

As shown in FIG. 3, the heat dissipation assembly body 1021 may be arranged at ½ to ¾ position of the housing 101 along a height direction (a direction indicated by arrow H in FIG. 3). The heat dissipation assembly body 1021 may divide the sealed space formed by the housing 101 into a first space 11, which may be configured to accommodate the cooling liquid and the to-be-cooled component, and a second space 12, which may be configured to maintain the pressure.

For example, the first space 11 containing the cooling liquid is located at the bottom of the housing. For example, the cooling liquid may be contained in one or more containers. Each container may accommodate one or more to-be-cooled components. Alternatively, the cooling liquid may be placed directly in the first space 11.

In an embodiment of the present disclosure, the bottom of the container may occupy the entire bottom of the housing 101 or only a portion of the bottom of the housing 101, which is not limited by the present disclosure.

In some embodiments, the first space 11 may contain the cooling liquid. The to-be-cooled component may be placed in the cooling liquid. The whole or a portion of the to-be-cooled component may be in contact with the cooling liquid. The cooling liquid may absorb heat from the to-be-cooled component. After the temperature of the cooling liquid reaches a boiling point, the cooling liquid may vaporize into the gas.

The heat dissipation assembly body 1021 may not be in contact with the cooling liquid. After the cooling liquid transforms into the gas, the heat dissipation assembly body 1021 may absorb the heat of the gas. The hot gas may liquefy into the liquid when meeting the cold heat dissipation assembly body 1021. The liquid may flow into the sealed space formed by the housing 101 under the action of gravity so as to realize the circulation of the cooling liquid. While absorbing the heat, the heat dissipation assembly body 1021 may exchange heat with the outside of the housing through the heat conducting pipe 1022 communicating with the heat dissipation assembly body 1021. Thus, the heat dissipation assembly may absorb heat continuously.

In other embodiments of the present disclosure, if the to-be-cooled component is a hashboard, and the hashboard includes a plurality of data processing chips, the cooling liquid may be an insulation liquid. The cooling liquid may not affect the operation of the data processing chips. The data processing chips may be placed in the cooling liquid for cooling during the operation.

In other embodiments of the present disclosure, the cooling liquid may include a liquid with a lower boiling point, for example, the boiling point of the cooling liquid may be lower than a certain preset threshold. The cooling liquid with the lower boiling point may be easy to vaporize and absorb the heat faster. The cooling efficiency may be higher. The cooling liquid is, for example, a fluorinated liquid. The preset threshold may include, for example, 70, 62, 60, and 50 Celsius degrees. The suitable cooling liquid may be selected according to the actual situation, which is not limited by the present disclosure.

Figure 2:
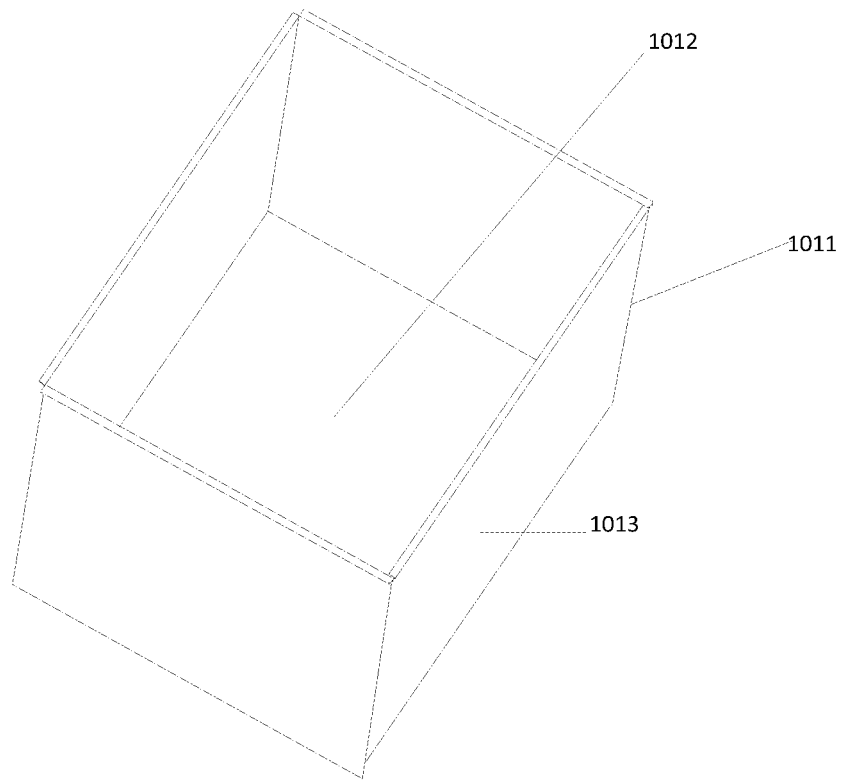
FIG. 2 is a schematic structural diagram of a partial outer housing of the cooling device according to an embodiment of the present disclosure.

In an embodiment of the present disclosure, as shown in FIG. 2, the housing 101 includes a container body 1011 and a cover plate (not shown in the figure). An opening is arranged at the top of the container body 1011. The cover plate is arranged at the top of the container body 1011, which is convenient to put the cooling liquid, the heat dissipation assembly 102, the to-be-cooled component, etc. in the housing 101. The container body 1011 and the cover plate may be sealed by a seal member, so that a sealed space may be formed inside the housing. In the cooling device, dust may not be accumulated, and no noise may be generated during the cooling process of the to-be-cooled component.

The seal member may include, for example, a seal ring made of silicone gel.

Exemplarily, the container body 1011 may be cuboid and include a bottom plate 1012 and four side plates 1013 connected to the bottom plate 1012.

The four side plates 1013 may be fixedly connected to each other or detachably connected to each other through a connector, which is not limited by the present disclosure.

Based on the technical solution, to facilitate movement of the cooling device 10, universal wheels may be arranged at the bottom of the container body 1011. A number of the universal wheels may be four. The universal wheels may be arranged at four corners of the bottom of the container body 1011.

In embodiments of the present disclosure, the housing 101 may include a plurality of structures, which is not limited to the above structure.

The heat dissipation assembly body 1021 may be arranged inside the housing 101 through a bracket or fixed on the inner wall of the housing 101.

In the cooling device of embodiments of the present disclosure, the cooling liquid may be accommodated inside the housing of the cooling device. After the cooling liquid transforms into the gas by absorbing the heat of the to-be-cooled component, the gas may be converted into the liquid through the heat dissipation assembly. Thus, the to-be-cooled component may be cooled. The cooling efficiency may be relatively high. The cooling liquid may be circulated and used.

Based on embodiments of the present disclosure, the heat dissipation assembly included in the cooling device of the present disclosure is described in detail in connection with FIG. 3 to FIG. 6.

In an embodiment of the present disclosure, the heat dissipation assembly body 1021 may include a cooling pipe 1023 and a plurality of heat dissipation fins 1024 arranged at the cooling pipe 1023. The heat conducting pipe 1022 may communicate with the cooling pipe 1023.

Further, the cooling device 10 may include a third container 103. The third container 103 may be arranged outside of the housing 101. The third container 103 may communicate with the heat conducting pipe 1022.

Specifically, the heat-exchange liquid may be accommodated inside the cooling pipe 1023. The cooling pipe 1023 may communicate with the heat conducting pipe 1022. The heat conducting pipe 1022 may communicate with the third container 103 outside the housing 101. Thus, the heat-exchange liquid may circulate in the cooling pipe 102, the heat conducting pipe 1022, and the third container 103 to maintain the temperature of the heat-exchange liquid inside the cooling pipe 1022 to be relatively low. Therefore, the heat dissipation assembly body 1021 may absorb the heat continuously from the vaporized gas of the cooling liquid.

The third container 103 may be fixed at the outer wall of the housing 101 through a connector.

The heat dissipation fin 1024 may be made of copper or aluminum alloy material. The cooling pipe 1023 may be made of copper alloy material.

Further, the heat exchange fluid in the third container 103 may be cooled by a radiator outside the cooling device 10. For example, the radiator may include a fan.

The air outlet of the fan may face the third container 103 for cooling the heat exchange fluid in the third container 103. Thus, the temperature of the heat exchange fluid flowing into the heat conducting pipe 1022 is relatively low.

In embodiments of the present disclosure, the heat dissipation assembly body 1021 may be implemented in the following manner.

Figure 4A:
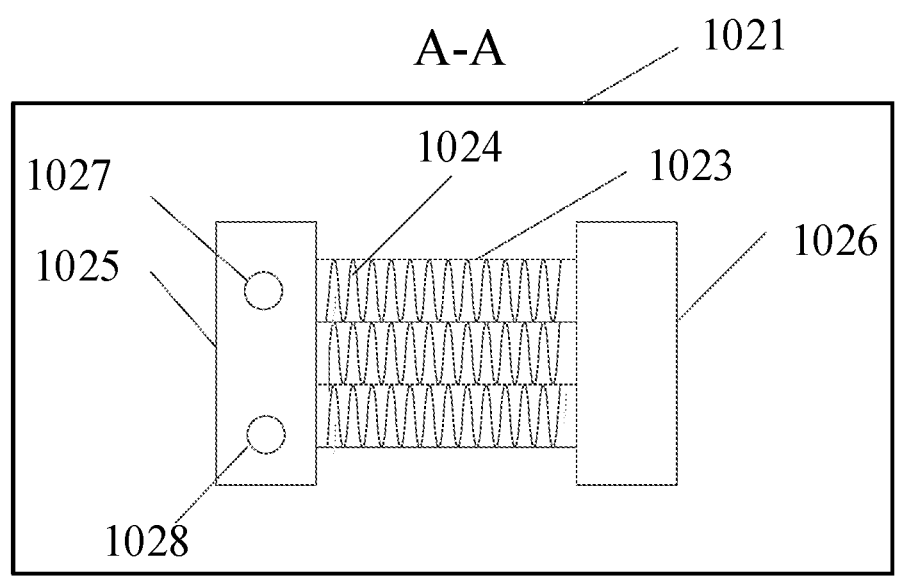
FIG. 4A is a schematic top view structural diagram showing a body of a heat dissipation assembly according to an embodiment of the present disclosure.

In an embodiment, as shown in FIG. 4A, which provides a top view of a cross-section A-A of FIG. 3, the heat dissipation assembly body 1021 further includes a first container 1025 and a second container 1026 arranged opposite to each other. The cooling pipe 1023 includes a plurality of rows of pipes arranged parallelly. An end of the cooling pipe 1023 communicates with the first container 1025. Another end of the cooling pipe 1023 communicates with the second container 1026. Thus, the heat-exchange liquid may be circulated in the first container 1025, the cooling pipe 1023, and the second container 1026.

Further, the heat dissipation assembly body 1021 may further include two side plates (not shown in the figure), which may be configured to fix the first container 1025, the second container 1026, and the cooling pipe 1023 together. The side plates are located on two sides of the cooling pipe 1023, which are not connected to the first container 1025 and the second container 1026.

Figure 4B:
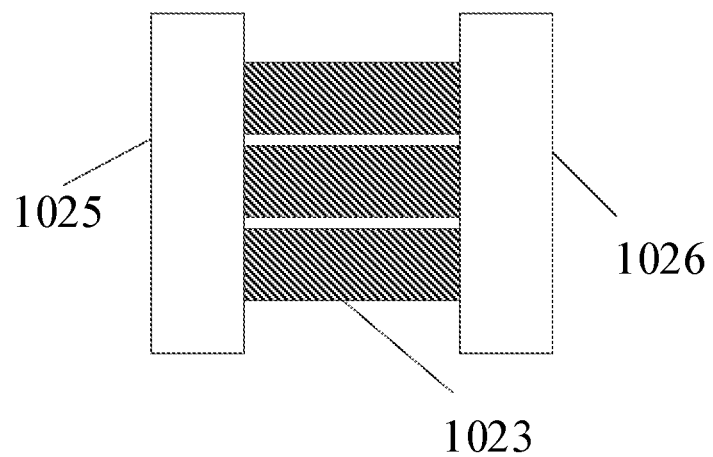
FIG. 4B is a schematic front view structural diagram showing the body of the heat dissipation assembly according to an embodiment of the present disclosure.

As shown in FIG. 4B, to reduce the volume of the heat dissipation assembly body 1021, the cooling pipe 1023 may be a flat pipe. The width of the cooling pipe 1023 in the front view FIG. 4B is much larger than the width of the cooling pipe 1023 in the top view FIG. 4A.

Specifically, the cooling pipe 1023 may include a plurality of rows of pipes arranged in parallel. The plurality of rows of pipes arranged in parallel may be divided into two portions of pipes. For example, the heat-exchange liquid may flow from the first container 1025 to a portion of pipes and then flow to the second container 1026. Then, the heat-exchange liquid may flow from the second container 1026 to the other portion of the pipes to flow to the first container 1025. Thus, the heat-exchange liquid may be circulated in the first container 1025, the cooling pipe 1023, and the second container 1026.

In the above specific embodiment, the heat dissipation assembly body 1021 has a relatively large surface area and a relatively small volume.

Further, the heat conducting pipe 1022 may include a liquid inlet pipe and a liquid outlet pipe. A liquid inlet 1027 and a liquid outlet 1028 may be arranged at the top of the first container 1025. The liquid inlet pipe may be connected to the liquid inlet 1027. The liquid outlet pipe may be connected to the liquid outlet 1028.

Specifically, the heat conducting pipe 1022 may include two portions of pipes, that is, a liquid inlet pipe and a liquid outlet pipe. The liquid inlet pipe may be configured to transfer the heat-exchange liquid outside of the cooling device 10 into the first container 1025. The liquid outlet pipe may be configured to transfer the heat-exchange liquid in the first container 1025 into the third container 103 outside of the cooling device 10.

Further, as shown in FIG. 4A, wave-shaped heat dissipation fins 1024 are arranged in a gap between adjacent cooling pipes 1023. Specifically, for the plurality of rows of pipes arranged in parallel included in the cooling pipe 1023, the wave-shaped heat dissipation fins 1024 may be arranged in the gap between any adjacent pipes.

In another embodiment, the cooling pipe 1023 may be inserted between the heat dissipation fins 1024 by a Fin insertion process. The cooling pipe 1023 may include an inlet A and an outlet B. The heat conducting pipe 1022 may include a liquid inlet pipe and a liquid outlet pipe. The liquid inlet pipe may be connected to the inlet A of the cooling pipe 1023. The liquid outlet pipe may be connected to the outlet B of the cooling pipe 1023.

Figure 5:
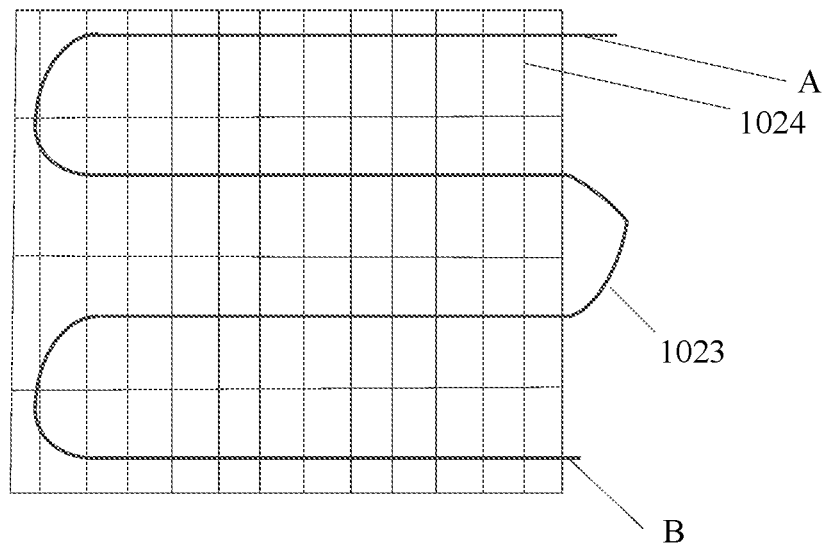
FIG. 5 is a schematic top view structural diagram showing the body of the heat dissipation assembly according to an embodiment of the present disclosure.

Specifically, as shown in FIG. 5, the heat dissipation assembly body 1021 is realized through the Fin insertion process. The cooling pipe 1023 may be a copper pipe. The cooling pipe 1023 is bent. The cooling pipe 1023 includes an inlet and an outlet. The inlet pipe of the heat conducting pipe 1022 is connected to the inlet. The outlet pipe of the heat conducting pipe 1022 is connected to the outlet to realize the circulation of the heat exchange fluid inside the cooling pipe 1023.

Figure 6:
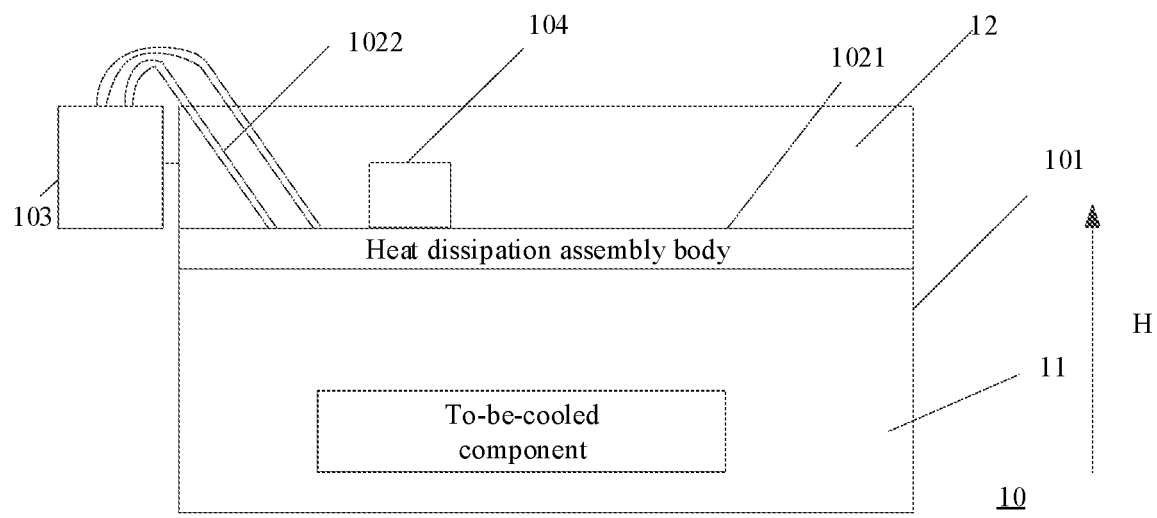
FIG. 6 is a schematic front view structural diagram of the cooling device according to another embodiment of the present disclosure.

Based on the embodiment, as shown in FIG. 6, the cooling device may further include at least one fan 104. The fan 104 is arranged inside the second space 12 and configured to enhance the flow of the gas.

The fan 104 may enhance the flow of the gas and heat exchange to cause the gas obtained after vaporization to be quickly liquefied.

The fan 104 may be arranged at the heat dissipation assembly body 1021. The air outlet of the fan 104 may face the heat dissipation assembly body 1021. The fan 104 may adjust a rotation speed according to the air pressure in the sealed space. The energy efficiency utilization rate may be high.

Figure 7:
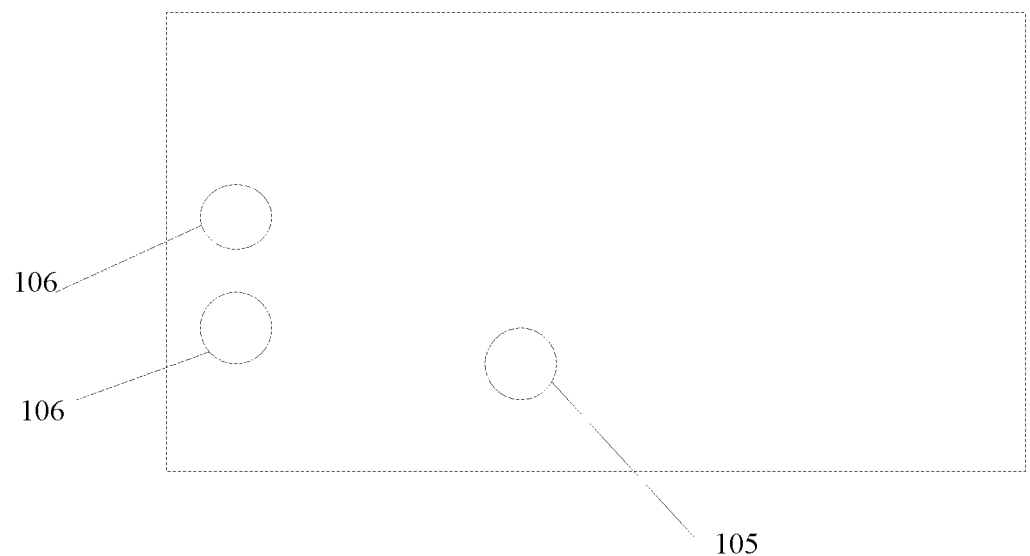
FIG. 7 is a schematic top view structural diagram of the cooling device according to another embodiment of the present disclosure.

Further, as shown in FIG. 7, FIG. 7 is a top view of the cooling device 10. A wire hole 105 is arranged at the housing 101 and configured to arrange the power cord through. The power cord may be configured to provide power to the to-be-cooled component and the fan 104. The wire hole 105 may be sealed through a seal material. The seal material may include, for example, rubber.

An opening 106 may be arranged at the housing 101 and configured to arrange the heat conducting pipe 1022 through. The opening 106 may be sealed through a seal material.

In some other embodiments of the present disclosure, a switch valve may be arranged at the heat conducting pipe 1022 outside of the cooling device 10 and configured to control the flow of the heat-exchange liquid.

In some embodiments, the cooling device may accommodate the cooling liquid and the heat dissipation assembly through the housing. The heat dissipation assembly may realize the circulation of the heat-exchange liquid through the heat dissipation assembly body and the heat conducting pipe to dissipate heat. The structure may be simple. After the cooling liquid transforms into the gas by absorbing the heat of the to-be-cooled component, the heat dissipation assembly may convert the gas into the liquid to cool the to-be-cooled component. The cooling efficiency may be high. The cooling liquid may be circulated and used.

Embodiments of the present disclosure may further provide a data processing apparatus including a power source and the cooling device of any one of the embodiments.

The data processing apparatus of embodiments of the present disclosure may have a similar principle and technical effects to the cooling device embodiments, which is not repeated here.

When used in the present disclosure, although the terms "first," "second," etc., may be used in the present disclosure to describe various elements. These elements should not be limited by these terms. These terms are only used to distinguish one element from another element. For example, without changing the meaning of the description, a first element may be referred to as a second element, and similarly, a second element may be referred to as a first element, as long as all occurrences of the "first element" are renamed consistently and all occurrences "second element" are renamed consistently. The first element and the second element may be both elements but may not be the same element.

The terms used in the present disclosure are only used to describe embodiments and are not used to limit the claims. As used in the description of the embodiments and claims, unless the context clearly otherwise specified, the singular forms "a," "an," and "the" are intended to also include plural forms. Similarly, the term "and/or" as used in the present disclosure may refer to any and all possible combinations, including one or more of the associated lists. In addition, when used in the present disclosure, the term "comprise" and its variants "comprises" and/or "comprising" may refer to the existence of the stated features, wholes, steps, operations, elements, and/or assemblies, but do not exclude the existence or addition of one or more other features, wholes, steps, operations, elements, assemblies, and/or groups of these features, wholes, steps, operations, elements, and assemblies.

The various aspects, implementation manners, implementations, or features in the described embodiments may be used alone or in any combination.

The above technical description may refer to the accompanying drawings, which form a portion of the present disclosure, and through the description, the accompanying drawings show implementations in accordance with the described embodiments. Although these embodiments are described in sufficient detail to enable those skilled in the art to implement these embodiments, these embodiments are non-limiting. As such, other embodiments may be used without departing from the scope of the described embodiments, and changes may also be made to the embodiments. For example, the sequence of operations described in the flowchart is non-limiting. Thus, the sequence of two or more operations explained in the flowchart and described according to the flowchart may be changed according to several embodiments. As another example, in several embodiments, one or more operations illustrated in the flowchart and described according to the flowchart are optional or may be deleted. In addition, certain steps or functions may be added to the disclosed embodiments, or the sequence of two or more steps may be replaced. All these changes may be considered to be included in the disclosed embodiments and claims.

In addition, the terminology is used in the above technical description to provide a thorough understanding of the described embodiments. However, too many details may not be required to implement the described embodiments. Therefore, the above description of the embodiments may be presented for explanation and description. The embodiments presented in the above description and the examples disclosed according to these embodiments are provided separately to add context and help understand the described embodiments. The above description is not intended to be exhaustive or to limit the described embodiments to the precise form of the present disclosure. Based on the above teachings, several modifications, options, and changes may be feasible. In some cases, well-known processing steps may not be described in detail to avoid unnecessarily affecting the described embodiments.

What is claimed is:

1. A cooling device comprising:
   a housing including a sealed space for accommodating a cooling liquid, the cooling liquid being in contact with a to-be-cooled component; and
   a heat dissipation assembly including:
      a heat dissipation assembly body arranged in the sealed space formed by the housing and configured to, after the cooling liquid transforms into a gas by absorbing heat of the component, absorb heat of the gas to convert the gas into liquid, the heat dissipation assembly body being arranged at a ½ to ¾ position along a height direction of the housing, and the heat dissipation assembly body dividing the sealed space into a first space for accommodating the cooling liquid and the component and a second space for maintaining a pressure; and
   a heat conducting pipe communicating with the heat dissipation assembly body and at least partially located outside the housing; and
   a fan arranged in the second space and configured to enhance flow of the gas, wherein:
   the fan is arranged at the heat dissipation assembly body;
   an air outlet of the fan faces the heat dissipation assembly body; and
   the fan adjusts a rotation speed according to the pressure of the sealed space.

2. The cooling device of claim 1, wherein the heat dissipation assembly body further includes:
   a cooling pipe communicating with the heat conducting pipe; and
   a plurality of heat dissipation fins arranged at the cooling pipe.

3. The cooling device of claim 2, wherein:
   the heat dissipation assembly body further includes a first container and a second container arranged opposite to each other; and
   the cooling pipe includes a plurality of rows of pipes arranged in parallel, an end of the cooling pipe communicating with the first container, and another end of the cooling pipe communicating with the second container to circulate heat exchange liquid in the first container, the cooling pipe, and the second container.

4. The cooling device of claim 3, wherein:
the heat conducting pipe includes a liquid inlet pipe and a liquid outlet pipe;
the first container includes a liquid inlet and a liquid outlet at top of the first container;
the liquid inlet pipe is connected to the liquid inlet; and
the liquid outlet pipe is connected to the liquid outlet.

5. The cooling device of claim 2, wherein the cooling pipe includes a flat pipe.

6. The cooling device of claim 3, herein a wave-shaped heat dissipation fin of the plurality of heat dissipation fins is arranged in a gap between neighboring rows of the cooling pipe.

7. The cooling device of claim 2, wherein:
the cooling pipe is inserted in the heat dissipation fin;
the cooling pipe includes an inlet and an outlet;
the heat conducting pipe includes a liquid inlet pipe and a liquid outlet pipe;
the liquid inlet pipe is connected to the inlet of the cooling pipe; and
the liquid outlet pipe is connected to the outlet of the cooling pipe.

8. The cooling device of claim 1, wherein the housing includes:
a wire hole configured to arrange a power cord through and being sealed by a sealing material, the power cord being configured to provide power to the component and the fan.

9. The cooling device of claim 8, further comprising:
a third container arranged outside the housing and communicating with the heat conducting pipe.

10. The cooling device of claim 1, wherein the cooling liquid includes insulation liquid and a boiling point lower than a predetermined threshold.

11. The cooling device of claim 1, wherein the to-be-cooled component includes a hashboard including a plurality of data processing chips.

12. A data processing apparatus comprising:
a power source; and
the cooling device including:
a housing including a sealed space for accommodating cooling liquid, the cooling liquid being in contact with a to-be-cooled component; and
a heat dissipation assembly including:
a heat dissipation assembly body arranged in the sealed space formed by the housing and configured to, after the cooling liquid transforms into a gas by absorbing heat of the to-be-cooled component, absorb heat of the gas to convert the gas into liquid, the heat dissipation assembly body being arranged at a ½ to ¾ position along a height direction of the housing, and the heat dissipation assembly body dividing the sealed space into a first space for accommodating the cooling liquid and the to-be-cooled component and a second space for maintaining a pressure; and
a heat conducting pipe communicating with the heat dissipation assembly body and at least partially located outside the housing; and
a fan arranged in the second space and configured to enhance flow of the gas, wherein:
the fan is arranged at the heat dissipation assembly body;
an air outlet of the fan faces the heat dissipation assembly body; and
the fan adjusts a rotation speed according to the pressure of the sealed space.

13. The data processing apparatus of claim 12, wherein the heat dissipation assembly body further includes:
a cooling pipe communicating with the heat conducting pipe; and
a plurality of heat dissipation fins arranged at the cooling pipe.

14. The data processing apparatus of claim 13, wherein:
the heat dissipation assembly body further includes a first container and a second container arranged opposite to each other; and
the cooling pipe includes a plurality of rows of pipes arranged in parallel, an end of the cooling pipe communicating with the first container, and another end of the cooling pipe communicating with the second container to circulate heat exchange liquid in the first container, the cooling pipe, and the second container.

15. The data processing apparatus of claim 14, wherein:
the heat conducting pipe includes a liquid inlet pipe and a liquid outlet pipe;
the first container includes a liquid inlet and a liquid outlet at top of the first container;
the liquid inlet pipe is connected to the liquid inlet; and
the liquid outlet pipe is connected to the liquid outlet.

16. The data processing apparatus of claim 13, wherein the cooling pipe includes a flat pipe.

17. The data processing apparatus of claim 13, wherein a wave-shaped heat dissipation fin of the plurality of heat dissipation fins is arranged in a gap between neighboring rows of the cooling pipes.

18. The data processing apparatus of claim 13, wherein:
the cooling pipe is inserted in the heat dissipation fin;
the cooling pipe includes an inlet and an outlet;
the heat conducting pipe includes a liquid inlet pipe and a liquid outlet pipe;
the liquid inlet pipe is connected to the inlet of the cooling pipe; and
the liquid outlet pipe is connected to the outlet of the cooling pipe.

* * * * *